United States Patent [19]

Woods et al.

[11] Patent Number: 4,668,713
[45] Date of Patent: May 26, 1987

[54] CONFORMAL COATING SYSTEMS

[75] Inventors: John Woods, Dublin; John M. Rooney, Kildare; Bernard J. Bolger, Dublin, all of Ireland

[73] Assignee: Loctite (Ireland) Limited, Dublin, Ireland

[21] Appl. No.: 809,099

[22] Filed: Dec. 16, 1985

[30] Foreign Application Priority Data

Dec. 21, 1984 [IE] Ireland ................................. 3300/84

[51] Int. Cl.$^4$ ............................................... C08F 2/50
[52] U.S. Cl. ..................................... 522/174; 522/167
[58] Field of Search ................................ 522/167, 174

[56] References Cited

U.S. PATENT DOCUMENTS 3,661,744  5/1972  Kehr ................................ 204/159.14
4,119,617 10/1978  Hamyuda ............................. 528/368
4,230,740 10/1980  Moyer ................................. 522/167
4,333,987  6/1982  Kwart ................................. 428/419
4,415,604 11/1983  Nativi ................................. 427/54.1
4,424,252  1/1984  Nativi ................................. 428/209
4,451,523  5/1984  Nativi ................................. 428/209

Primary Examiner—Paul R. Michl
Attorney, Agent, or Firm—Walter J. Steinkraus; Eugene F. Miller

[57] ABSTRACT

Compositions useful as UV curable conformal coatings are mixtures, substantially free of isocyanate condensation catalyst, of the following constituents:

(i) a compound having two or more alkenyl or alkynyl groups;
(ii) a compound having two or more mercapto groups;
(iii) a compound having two or more isocyanate groups; and
(iv) a free radical photoinitiator.

The composition cures by a secondary mechanism in shadow areas and has a long pot life, for example 8–24 hours.

9 Claims, No Drawings

CONFORMAL COATING SYSTEMS

This invention concerns polymerisable compositions which have their primary utility in the area of coatings and sealants. The invention has particular utility in the area of conformal coatings for printed circuit boards and electronic components and will be described in connection with such utility, although other uses are contemplated.

Printed circuit boards and electronic components may be coated with a protective film to avoid or at least minimise degradation in electrical performance due to contamination. The most damaging, and usually the most prevalent contaminant generally is considered to be moisture or humidity. Excessive moisture or humidity will drastically lower insulation resistance between conductors, accelerate high-voltage breakdown and dendritic growth, and corrode conductors. Other contaminants which may damage printed circuit boards include various chemicals which may be residues of the manufacturing process such as fluxes, organic solvents, release agents, metal particles and marking inks, and contaminants which inadvertently may be deposited by human handling such as body greases, fingerprints, cosmetics and food stains. Ambient operating conditions may also contribute a variety of contaminants such as salt spray, dirt and dust, oil, fuel, acid, corrosive vapour and fungus. Although the list of possible contaminants is almost endless, in all but the most severe cases their destructive action effectively can be eliminated by provision of a good conformal coating.

In addition to providing protection from contaminants, conformal coatings also provide a certain degree of protection to mechanical shock, vibration and tampering.

Various conformal coating systems are known in the art and are available commercially. Such coating systems include systems based on acrylics, polyurethanes, epoxy resins, silicone resins, polyimides and dialkyl phthalate varnishes. Further information about these systems can be obtained from U.S. Pat. Nos. 4,415,604; 4,424,252 and 4,451,523, all assigned to Loctite Corporation.

It is also known to make conformal coatings using thiol-ene polymer systems. The essential components of a thiol-ene polymer system are a multifunctional alkene and a multifunctional thiol. Representative groups of thiol-ene polymers are described in U.S. Pat. No. 3,661,744 assigned to W. R. Grace & Co. and in U.S. Pat. No. 4,119,617 assigned to Showa Highpolymer Co. Ltd.

It is usual to cure conformal coatings by exposure to actinic radiation, particularly ultraviolet light. However certain components on a circuit board may stand proud of the surface of the board and the conformal coating may be required to protect areas around and beneath these components which cannot be exposed directly to the UV radiation.

These areas, called "shadow regions", must be cured by a secondary curing system. Currently available UV-curing thiol-ene based conformal coatings require a secondary thermal cure for the shadow regions. However the heat required may have a deleterious effect on the substrate.

Currently available UV-curing (meth)acrylate based conformal coatings do not adequately surface cure unless high intensity, relatively short wavelength UV light is employed, but this is unsafe, the exposure time is relatively long and, here again, the heat associated with these conditions may affect the substrate.

U.S. Pat. No. 4,424,252 describes a two component coating system comprising (1) a first component comprising at least one urethane-acrylate or methacrylate, and a mono- or polyfunctional acrylate or methacrylate diluent and a polymerisation initiator of the photoinitiator type, and (2) a second component comprising a polyisocyanate. The polyisocyanate component provides a secondary cure mechanism. While this acrylic system is satisfactory if it is used shortly after mixing, it has been found to have a relatively poor pot life because it sets up in a short time due to crosslinking between the isocyanate and hydroxy groups in the acrylic component. U.S. Pat. No. 4,333,987 describes a method improving bonding between vinyl resins and UV curable acrylated urethane resins using particular vinyl compositions and UV curable compositions which include polythiols. One exemplary formulation for a UV curable composition includes urethane acrylate resins which may have some free isocyanate groups prior to addition of the polythiol. This composition will not have a substantial pot life, however, because a condensation catalyst, dibutyl tin dilaurate, is added with the polythiol ingredient. Also, although some thiol addition may occur under radiation curing conditions, the reactivity of acrylic resins with free radicals makes acrylic homopolymer the predominant radiation cured product.

The present invention provides a coating composition, especially useful for conformal coating, comprising (i) a multifunctional 'ene
(ii) a multifunctional thiol
(iii) a multifunctional isocyanate and
(iv) a polymerisation initiator of the photoinitiator type.

The composition is substantially free of isocyanate condensation catalyst such a tin salts and the like.

The term "'ene" as used herein covers both alkenes and alkynes. Preferably the composition is a two-part composition in which the first part comprises the multifunctional 'ene, the multifunctional thiol and the photoinitiator and the second part comprises the multifunctional isocyanate. However an alternative way of formulating the composition is to include the, the isocyanate and the photoinitiator in the first part and the thiol in the second part; in this case, the 'ene and isocyanate functionalities may be on the same molecule, which should be free of active hydrogen compounds which are known to react with isocyanates e.g. acid, alcohols, phenols, amines, thiols (see Kirk-Othmer, Encyclopedia of Chemical Technology, Volume 30 page 789).

Compositions according to the invention can be cured by direct exposure of the surface to long wavelength UV light (which is relatively safe) at low intensities and for relatively short times. Curing at ambient temperature is possible and therefore thermally sensitive substrates can be coated. A particular feature of the invention is that the mixed formulation containing both the thiol/ene component and the isocyanate component shows a good pot life; compositions can be designed to have a pot life in the range 8-24 hours, for example. In view of the reactivity of isocyanates with alcohols and thiols, it is surprising that a good pot life can be obtained in a formulation which also cures readily in shadow areas on a substrate.

The preferred weight ranges of the constituents of the composition are as follows (expressed as percentages of the total weight of the constituents (i)–(iv)):

(i) multifunctional 'ene 5–80%, particularly 15–45%, for example 22–37%
(ii) multifunctional thiol 5–80%, particularly 25–60%, for example 30–53%
(iii) multifunctional isocyanate 10–90%, particularly 10–50%, for example 12–45%.
(iv) photoinitiator 0.05–10%, particularly 0.5–2.5%, for example 1%.

It will be appreciated that the weight ratios of the components depend upon the functionality and molecular weight of each of the components, particularly if a very reactive form of isocyanate, for example, is used.

PART A

The multifunctional 'ene preferably has alkene groups chosen from O-allyl, N-allyl, O-vinyl, N-vinyl and p-vinyl phenol ether groups. Suitable polyenes are described in U.S. Pat. No. 3,661,744 assigned to W. R. Grace & Co., the contents of which are incorporated herein by reference. As used therein, the term polyene refers to single or complex species of alkenes having a multiplicity of terminal reactive carbon-to-carbon double bonds per average molecule. The term "terminal" means that functional unsaturation is at the end of the main chain or a branch of the main chain in the molecule, or not more than 10 carbon atoms from the end of the main chain or a branch of the main chain in the molecule. The polyene may be represented by the formula:

$$[A]-(X)_m$$

wherein m is an integer of at least 2, wherein X is a member selected from the group consisting of:

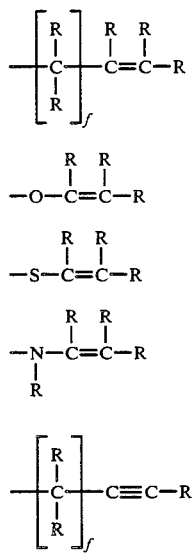

In the groups (a) to (e), f is an integer from 1 to 9; R is a radical selected from the group consisting of hydrogen, fluorine, chlorine, furyl, thienyl, pyridyl, phenyl and substituted phenyl, benzyl and substituted benzyl, alkyl and substituted alkyl, alkoxy and substituted alkoxy, and cycloalkyl and substituted cycloalkyl. The substituents on the substituted members are selected from the group consisting of nitro, chloro, fluoro, acetoxy, acetamide, phenyl, benzyl, alkyl, alkoxy and cycloalkyl. Alkyl and alkoxy have from one to nine carbon atoms and cycloalkyl has from three to eight carbon atoms.

The member (A) is polyvalent; free of reactive carbon-to-carbon unsaturation; free of highly water-sensitive members; and consisting of atoms selected from the group consisting of carbon, oxygen, nitrogen, chlorine, bromine, fluorine, phosphorus, silicon and hydrogen.

The polyene component has a molecular weight in the range from about 64 to 20,000, preferably about 200 to about 10,000; and a viscosity in the range from essentially 0 to 20 million centipoises at 70° C., as measured by a Brookfield Viscometer.

Another suitable group of multifunctional alkenes are the unsaturated cycloacetal compounds such as are described in U.S. Pat. No. 4,119,617 assigned to Showa Highpolymer Co. Ltd., the contents of which are incorporated herein by reference. The compounds described therein have at least 2 unsaturated cycloacetal groups per molecule expressed by the formula:

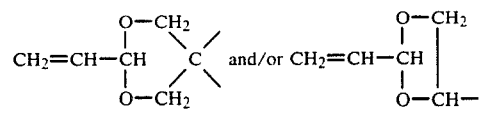

Other suitable multifunctional alkenes include multifunctional styrene derivatives. Acrylic, methacrylic and compounds with similarly activated double bonds are not intended to be included within the definition of alkene as used herein because of their tendency to homopolymerize under radical initiation conditions in competition with the thiol addition reaction.

The multifunctional thiol may be chosen from compounds having 2 or more mercapto groups (—SH) per molecule. Suitable polythiols are described in U.S. Pat. Nos. 3,661,744 and 4,119,617 mentioned above. The polythiol component suitably has a molecular weight in the range from about 50 to about 20,000 and is of the general formula:

$$R_n-(SH)_n$$

where R is a polyvalent organic moiety free from reactive carbon-to-carbon unsaturation and n is at least two.

The mole ratio of multifunctional 'ene/multifunctional thiol is chosen so as to provide a dry-to-the-touch cured product which is without free surface moisture or surface tackiness and which permits substantially immediate handling of the coating and maintenance of the shape of the coating which might otherwise sag or creep. The mole ratio of ene/thiol groups will normally be in the range from about 0.2/1 to about 5/1, preferably about 0.75/1 to about 1.5/1.

PART B

The multifunctional isocyanate, to provide the secondary cure in shadow areas, is a polyisocyanate adduct of aromatic or aliphatic isocyanates or a mixture thereof. The polyisocyanates may generally be represented by the formula (O=C=N)=Q in which 1 is an integer from 2 to about 20, preferably 2 to about 5, and Q is an organic radical having a molecular weight up to about 5000 and a bonding capacity equal to 1. Examples of suitable polyisocyanates are described in U.S. Pat.

No. 4,424,252 assigned to Loctite Corporation, the contents of which are incorporated herein by reference. Particularly preferred is the polyisocyanate sold by Mobay Chemical Corporation under the Trade Mark MONDUR CB-75 in the United States of America and by Bayer AG under the Trade Mark DESMODUR L75 in Eurpoe which is an aromatic polyisocyanate dissolved in ethyl acetate having a solid content percent of about 75 percent, NCO content of approximately 12.5 to 13.5 percent, equivalent weight of 323 average and containing a maximum of about 0.7 percent free monomer based on resin solids.

The following mechanisms are available for the secondary cure.

1. Free isocyanate in Part B can react with water, specifically atmospheric moisture, cross linking through the formation of di-substituted ureas, i.e. according to the following formula:

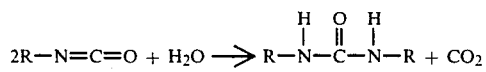

2. The thiol component of Part A is available for reaction with free isocyanate contained in Part B to form thiourethane ester linkages (α-ketosulphide) i.e. according to the following formula:

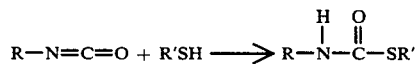

3. If optional hydroxy groups are present in the thiol/ene component of Part A, these hydroxy groups are available for reaction with the free isocyanate contained in Part B thereby forming urethane linkages i.e. according to the formula:

4. Free isocyanate in Part B can react with previously formed thiourethane groups to form allophanates, thus increasing cross-linking density, i.e., according to the following formula:

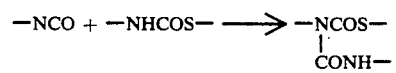

5. Free isocyanate in Part B can react with previously formed urea groups to form biurets, thus increasing cross-linking cross-link density, according to the following formula:

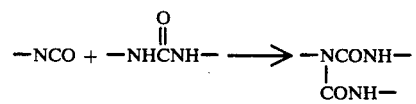

6. Any urethane group formed in optional mechanism 3 can react with free isocyanate in Part B to form allophanates according to the following formula:

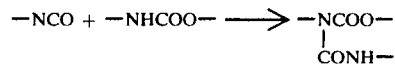

All six of the above curing mechanisms are catalysed by heat and since most UV sources also generate intense I.R. waves, an excellent heat source is available to help drive the secondary curing mechanism. Therefore, in many instances, significant portions of the "shadow areas" will be cured during the UV exposure. Experiments have shown that areas which do not co-cure substantially immediately during UV exposure will dry to a self-supporting film within 2 to 24 hours under conditions of ambient temperature and average relative humidity.

The proportions in which the reactants, Part A and Part B, may be combined can be varied relatively widely; generally it is preferred to employ the reactants in proportions such that the thiol is in excess relative to the isocyanate. However if the thiol/ene component has free hydroxyl groups, it is preferred to use an excess of isocyanate; this results in a shorter pot life but nevertheless an acceptable pot life can be obtained, depending upon the hydroxyl group content and the reactivity of the isocyanate used.

The polymerisation initiator may be any of the known free radical photoinitiators which are used in UV-curable polymer systems. Suitable photoinitiators are described under the name "photocuring rate accelerators" in U.S. Pat. No. 3,661,744, particularly the aldehyde and ketone carbonyl compounds having at least one aromatic nucleus attached directly to the

group. Examples include benzophenone, acetophenone and derivatives thereof.

Optionally the composition may contain an organic solvent (e.g. ethylacetate or 1,1,1-trichloroethane) and a free radical stabiliser or inhibitor to prevent premature offset of curing (e.g. hydroquinones, benzoquinones, naphthoquinones, phenanthraquinones and substituted compounds of any of the foregoing, or phenols such as 2,6-di-tert-butyl-4-methyl phenol.

Surfactants may also be included in Part A of the composition. The preferred surfactants are non-ionic surfactants having pendent free hydroxyl groups (which may react with free isocyanate in Part B).

Other optional ingredients of the composition include co-initiators or photosensitizers, thickeners, pigments, dyes, toughening agents, antioxidants, acids (e.g. phosphorous acid). wetting agents, flow control agents and adhesion promoters, all of which are of types known in the prior art.

The invention is illustrated in the following Examples:

EXAMPLE 1

A formulation was prepared containing 41.22 grams of triallyl-triazine trione, 57.50 grams of pentaerythritol tetrakis (β-mercaptopropionate), 0.10 grams of phosphorous acid, 0.98 grams of 2,2-dimethoxy-2-phenyl acetophenone and 0.20 grams of 2,5-di-tert-butyl-4-methyl phenol. This formulation will be referred to as Part A. A second formulation was prepared containing 17.50 grams of a polyisocyanate resin Desmodur L75 (a Trade Mark of Bayer AG) and 32.50 grams of 1,1,1-trichloroethane. This second formulation will be referred to as Part B. The weight ratio of alkene/thiol/isocyanate was 35:49:15 and the pot life of the formulation after mixing Parts A and B was more than 8 hours. Parts A and B were mixed and a few drops of the mixture were applied to a glass microscope slide and a thin film prepared by drawing a 150 micron film gauge along the surface of the slide. Half of the film was covered with an aluminum panel to prevent exposure to light. The slide was then exposed for 5 seconds to light from a medium-pressure mercury vapor arc with an intensity of 55 mw/cm$^2$ at 365 nm. After this time, the exposed portion of the film had cured to a dry film while the unexposed portion remained completely liquid. The slide was placed in a humidity chamber at 40° C. 95% relative humidity for 2 hours. After this time, the unexposed portion of the film was found to have cured to a slightly tacky film.

EXAMPLE 2

The procedure outlined in Example 1 was repeated with a mixture consisting of 100 grams of Part A and 100 grams of Part B (comprising 35 grams of the polyisocyanate resin and 65 grams of 1,1,1-trichloroethane). The weight ratio of alkene/thiol/isocyanate was 30:43:26 and the pot life of the formulation after mixing Parts A and B was more than 8 hours. After 5 seconds of irradiation the exposed portion of the film had cured to a dry film while the unexposed portion remained completely liquid. After the slide was placed in the humidity chamber for 2 hours, the unexposed portion of the film was found to have cured to a slightly tacky film.

EXAMPLE 3

The procedure outlined in Example 1 was repeated with a mixture consisting of 100 grams of Part A and 200 grams of Part B (comprising 70 grams of the polyisocyanate resin and 130 grams of 1,1,1-trichloroethane). The weight ratio of alkene/thiol/isocyanate was 24:34:41 and the pot life was more than 8 hours. After 5 seconds of irradiation the exposed portion of the film had cured to a dry film while the unexposed portion of the film remained completely liquid. After the slide was placed in the humidity chamber for 2 hours, the unxposed portion of the film had cured to a completely dry film.

EXAMPLE 4

The mixture prepared in Example 3 was applied to a glass microscope slide and a thin film prepared by drawing a 150 micron film gauge along the surface of the slide. Half of the film was covered with an aluminum panel to prevent exposure to light. After 5 seconds of irradiation with the light source described in Example 1, the exposed portion of the film had cured to a dry film while the unexposed portion remained completely liquid. The slide was then left 17 hours in the dark at ambient temperature (15° C.) and relative humidity (50%). After this time the unexposed portion of the film had cured to a dry film.

EXAMPLE 5

The mixture prepared in Example 3 was applied to a glass microscope slide and a thin film prepared by drawing a 150 micron film gauge along the surface of the slide. The film was then exposed to light from a medium-pressure vapor arc filtered through a glass sleeve so as to eliminate radiation below a wavelength of about 300 nm. The light intensity at 365 nm was 5 mw/cm$^2$.

EXAMPLE 6

A formulation was prepared containing 41.20 grams of 3,9-divinyl-2,4,8,10-tetraoxaspiro[5.5]undecane, 57.50 grams of pentaerythritol tetrakis (β-mercaptopropionate), 0.10 grams of phosphorous acid, 0.20 grams of 2,6-di-tert-butyl-4-methyl phenol, and 1.0 grams of 2,2,dimethoxy-2-phenyl acetophenone. This formulation will be referred to as Part C. A second formulation was prepared containing 70 grams of DESMODUR L75 (a Trade Mark of Bayer) and 130 grams of 1,1,1-trichloroethane. This second formulation will be referred to as Part D. The weight ratio of alkene/thiol/isocyanate was 24:34:41. Parts C and D were mixed and brush-coated onto glass microscope slides. Irradiation for one second under the light source described in Example 1 gave a dry film. Irradiation for 45-60 seconds under the light source described in Example 5 gave a dry film. Unexposed material cured to a dry film in 24 hours at 15° C. and 50% relative humidity. The pot life of the mixture was in excess of 6 hours under these conditions; the mixture was not observed after 6 hours but there was no sign of gelation at this time and a pot life in excess of 8 hours was expected.

We claim:

1. A coating composition, especially useful for conformal coating, the composition substantially free of isocyanate condensation catalyst and comprising the following constituents:
   (i) a compound having two or more 'ene groups wherein the 'ene groups are selected from the group consisting of alkenyl and alkynyl groups;
   (ii) a compound having two or more mercapto groups per molecule; the ratio of said 'ene groups to said mercapto groups in the composition being between 0.2/1 and 5/1,
   (iii) between 10% and 90% by weight of the constituents (i)–(iv) of an isocyanate compound having 2–20 isocyanate groups per molecule; and
   (iv) between 0.05% and 10% by weight of the constituents (i)–(iv) of a free radical photoinitiator.

2. A coating composition according to claim 1, formed by mixing a two part composition in which the first part comprises the said constituents (i), (ii), and (iv), and the second part comprises the constituent (iii).

3. A coating composition according to claim 1 wherein the 'ene groups are the alkyl or vinyl groups in the group consisting of O-allyl, N-allyl, O-vinyl, N-vinyl or p-vinyl phenol ether groups.

4. A coating composition as in claim 1 wherein constituent (i) is present in the range 5–80% by weight of the composition and the constituent (ii) is present in the range of 5–80% by weight of the composition.

5. A composition as in claim 1 wherein the number of thiol groups in the composition exceeds the number of isocyanate groups in the composition.

6. A composition as in claim 1 wherein the 'ene groups are selected from the group consisting of
   (i) groups of formulae (a)–(e).

(a) 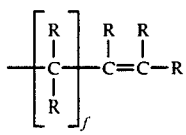

(b) 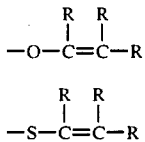

(c) 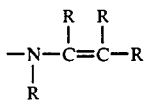

(d) 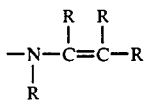

(e) 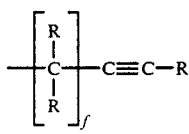

where f is an integer of 1-9; and R is a radical selected from the group consisting of hydrogen, fluorine, chlorine, furyl, thienyl, pyridyl, phenyl and substituted phenyl, benzyl and substituted benzyl, alkyl and substituted alkyl, alkoxy and substituted alkoxy, and cycloalkyl and substituted cycloalkyl, wherein the substituents on the substituted members are selected from the group consisting of nitro, chloro, fluoro, acetoxy, acetamide, phenyl, benzyl, alkyl, alkoxy and cycloalkyl, the alkyl and alkoxy groups have from one to nine carbon atoms and the cycloalkyl groups have from three to eight carbon atoms;

(ii) unsaturated cycloacetal groups of the formulae:

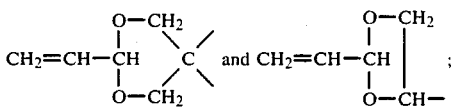

and (iii) styrene groups.

7. A composition as in claim 6 wherein the 'ene groups are p-vinyl phenol ether groups.

8. A composition as in claim 4 wherein the respective ranges of constituents are:
(i) 15-45%
(ii) 25-60%
(iii) 10-50%
(iv) 0.5-2.5%.

9. A composition as in claim 1 wherein the respective ranges are:
(i) 22-37%
(ii) 30-53%
(iii) 12-45%
(iv) 0.5-2.5%.

* * * * *